(12) United States Patent
Yamazaki et al.

(10) Patent No.: US 6,198,125 B1
(45) Date of Patent: Mar. 6, 2001

(54) SEMICONDUCTOR DEVICE AND METHOD OF FABRICATING SAME

(75) Inventors: Shunpei Yamazaki, Tokyo; Yasuhiko Takemura, Kanagawa, both of (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/227,276

(22) Filed: Jan. 7, 1999

Related U.S. Application Data

(62) Division of application No. 08/786,853, filed on Jan. 22, 1997, now Pat. No. 5,888,868.

(30) Foreign Application Priority Data

Jan. 22, 1996 (JP) ......................................... 8-28497
Jan. 26, 1996 (JP) ......................................... 8-32925

(51) Int. Cl.[7] ............................................... H01L 29/788
(52) U.S. Cl. ............................................ 257/316; 257/321
(58) Field of Search ............................ 257/316, 321; 438/257–267

(56) References Cited

U.S. PATENT DOCUMENTS

| | | | |
|---|---|---|---|
| 4,975,383 | * | 12/1990 | Baglee . |
| 5,049,515 | * | 9/1991 | Tzeng . |
| 5,135,879 | * | 8/1992 | Richardson . |
| 5,180,680 | * | 1/1993 | Yang . |
| 5,210,046 | * | 5/1993 | Crotti . |
| 5,350,937 | | 9/1994 | Yamazaki et al. ............ 257/316 |
| 5,460,987 | * | 10/1995 | Wen et al. . |
| 5,460,988 | * | 10/1995 | Hong . |
| 5,466,961 | | 11/1995 | Kikuchi et al. . |
| 5,506,160 | * | 4/1996 | Chang . |
| 5,598,037 | | 1/1997 | Kikuchi et al. . |
| 5,633,519 | * | 5/1997 | Yamazaki et al. ............ 257/315 |
| 5,918,115 | | 6/1999 | Kikuchi et al. . |

FOREIGN PATENT DOCUMENTS

| | | |
|---|---|---|
| 63-102372 | 5/1988 | (JP) . |
| 1-191480 | 8/1989 | (JP) . |
| 3-290960 | 12/1991 | (JP) . |
| 5-136374 | 6/1993 | (JP) . |
| 5-251711 | 9/1993 | (JP) . |

OTHER PUBLICATIONS

Wolf, "Silicon Processing for the VLSI Era vol. 2: Process Integration", pp. 12–13, Lattice Press, 1990.*
Howard Pein, "Performance of the 3–D Pencil Flash EPROM Cell and Memory Array", Nov. 1995, IEEE Transactions on Electronic Devices, vol. 42, No. 11, pp. 1982–1991.

* cited by examiner

Primary Examiner—Richard Booth
(74) Attorney, Agent, or Firm—Fish & Richardson P.C.

(57) ABSTRACT

The present invention relates to a nonvolatile semiconductor device using a vertical channel semiconductor device and a method of fabricating the same. The method starts with forming an insulator for device isolating having a depth D in a semiconductor substrate. The semiconductor substrate is etched with an etch depth d so that elevated portions are formed. A first conductive film is formed covering the elevated portions. After selectively and isotropically etched, the first conductive film is anisotropically etched so as to form floating gates on the side surfaces of the elevated portions. Sequently, a device insulating may be performed by selective oxidation technology. Further, a second conductive film is formed and anisotropically etched so that control gates are fabricated on the side surfaces of the elevated portions. In this case, forming a mask on predetermined regions of the elevated portions, the second conductive film may be etched to form gates of planar transistors or wirings. Then, a nonvolatile memory device is completed. If the depth D of the insulator and the etch depth d satisfy the following equation: D>d, a NAND circuit can be fabricated. Furthermore, a NAND circuit comprising planar MOS transistors for selective transistors and vertical channel transistors for memory cells may be manufactured.

5 Claims, 14 Drawing Sheets

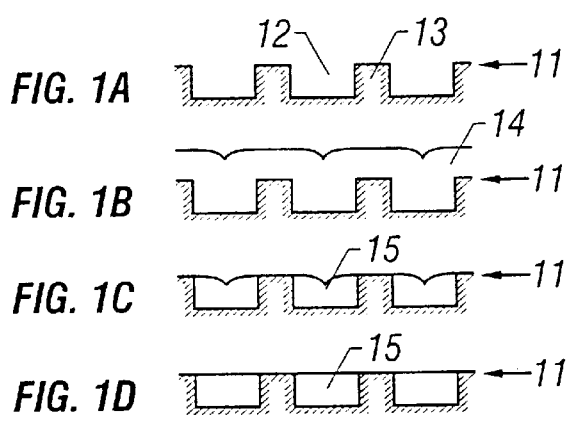
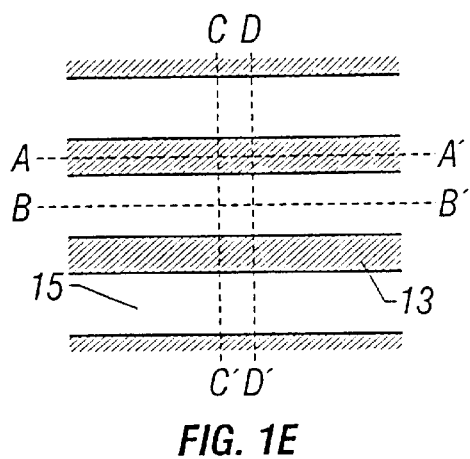
FIG. 1A
FIG. 1B
FIG. 1C
FIG. 1D
FIG. 1E
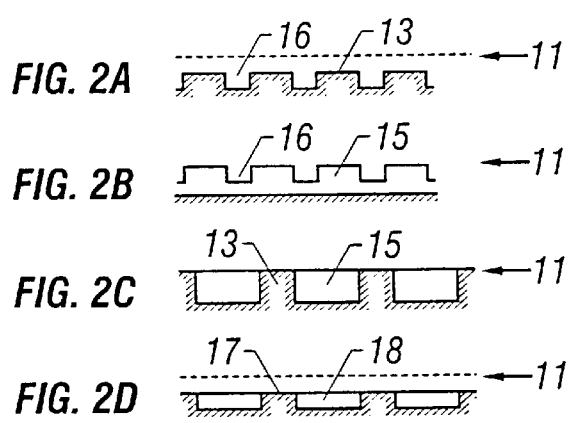
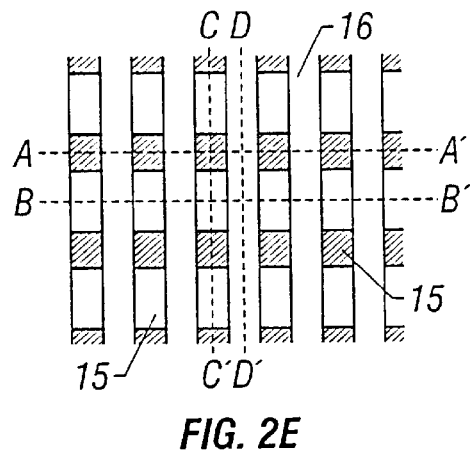
FIG. 2A
FIG. 2B
FIG. 2C
FIG. 2D
FIG. 2E
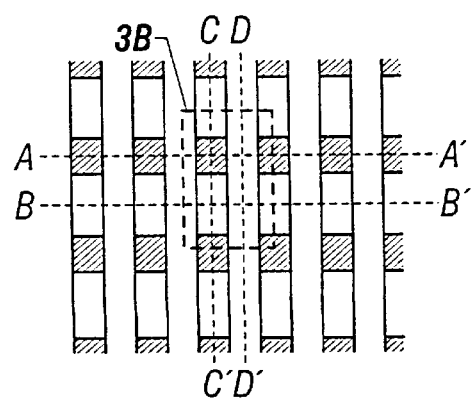
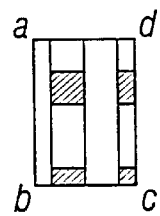
FIG. 3A
FIG. 3B

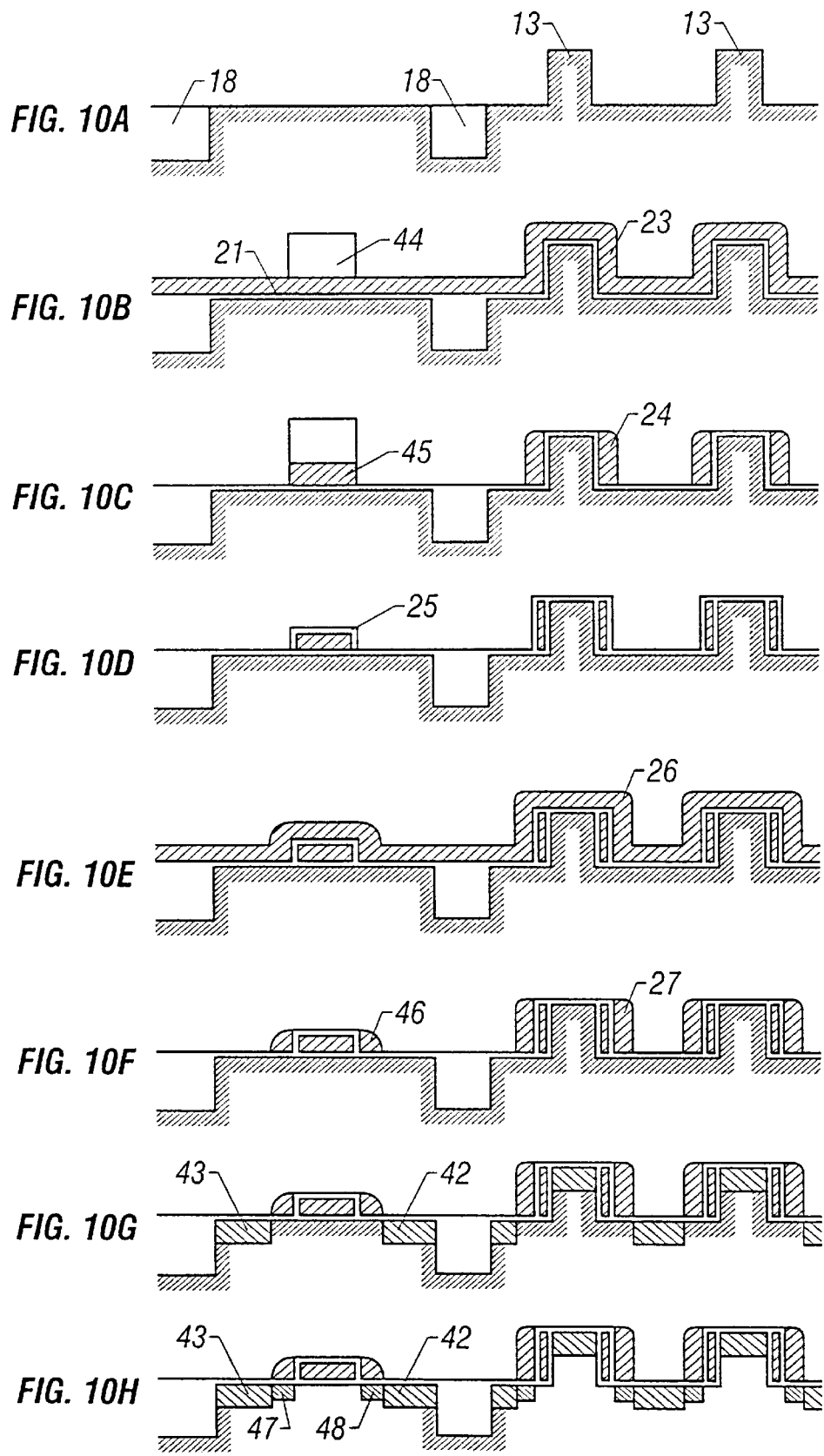

SEMICONDUCTOR DEVICE AND METHOD OF FABRICATING SAME

This is a divisional of U.S. application Ser. No. 08/786,853, filed Jan. 22, 1997, (now U.S. Pat. No. 5,888,868).

BACKGROUND OF THE INVENTION

1. Field of the Invention

The present invention relates to a technique for fabricating a semiconductor integrated circuit with a greater device density, and more particularly, to field-effect devices adapted for larger scales of integration and also to a method of fabricating such field-effect devices. A semiconductor device according to the invention is used especially advantageously as a nonvolatile semiconductor memory device having floating gates.

2. Description of the Related Art

Some conventional semiconductor devices are formed on a flat plane. Field-effect devices such as a MOS field-effect transistors (MOSFET) or a MISFET have a source, a drain, and a channel arranged substantially on a flat plane. The drain current is made to flow in a direction parallel to the substrate. In this planar device, however, limitations are imposed on the device area reduction as a matter of course. Therefore, in an attempt to obtain larger device densities, methods for manufacturing a planar device from plural layers and methods of fabricating a device structure itself in a form different from a planar structure have been discussed. An example of the latter methods includes a vertical-channel MOSFET proposed by us in Japanese Patent Unexamined Publication No. 13627/1994, which, in turn, corresponds to U.S. Pat. No. 5,350,937 and U.S. pending application Ser. No. 08/268,448, the disclosures of which are herein incorporated by reference. In particular, the drain is located over or under the source so that the drain current flows substantially vertically. This structure permits larger component densities.

The above-cited Japanese Patent Unexamined Publication No. 13627/1994 pertains to a nonvolatile semiconductor memory. Specifically, a floating gate and a control gate are formed by anisotropic etching on side surfaces of elevated portions which are formed on a semiconductor substrate. It is to be noted, however, only the fundamental device structure is shown. Neither the whole memory construction nor the fabrication process is described in detail. For example, with respect to its peripheral circuit, few mentions are made of its structure and fabrication process.

SUMMARY OF THE INVENTION

The present invention is intended to address the foregoing problems with the prior art technique.

It is an object of the present invention to provide an improved NAND-type nonvolatile memory.

A method of fabricating a semiconductor device in accordance with the present invention comprises the steps of:

(1) burying an insulator for isolating device components in a semiconductor device;

(2) etching the semiconductor substrate and the insulator to form elevated portions;

(3) depositing an insulating film on exposed surface portions of the semiconductor substrate;

(4) forming a first conductive film;

(5) etching the first conductive film selectively and isotropically;

(6) anisotropically etching the first conductive film to form floating gates on side surfaces of the elevated portions;

(7) forming an insulating film on surfaces of the floating gates;

(8) forming a second conductive film; and (9) anisotropically etching the second conductive film to form control gates on the side surfaces of the elevated portions so as to cover the floating gates.

The processing steps (5) and (6) may be interchanged in order. A doping step for diffusing dopants that impart one conductivity type may be carried out at any time as long as this step is performed later than the processing step (2). Furthermore, if multilevel metallization is utilized in the same way as in the prior art technique, an interlayer insulator is deposited after the processing step (9), and the top layer of metallization may be deposited.

The processing step (1) may use LOCOS (localized oxidation of silicon). Also, trench isolation technology which has attracted attention as a new device isolation technology may also be employed. In the processing steps (3) and (7), the insulating films may be formed by thermal oxidation, thermal nitridation, or CVD.

The first conductive film deposited by the processing step (4) will become floating gates after etching. Generally, as a result of the anisotropic etching of the step (6), the first conductive continuous film is left on one side surface of each elevated portion. If plural devices should be formed on each one side surface, it is necessary to isolate the floating gates of one device from the floating gates of other devices. For this purpose, the processing step (5) is carried out. In the step (5), the first conductive film on the side surfaces of the elevated portions is selectively etched. Then, the anisotropic etching of the step (6) is effected to obtain floating gates for the individual devices on each one side surface.

As mentioned previously, the processing steps (5) and (6) can be interchanged in order, because these two etching steps are independent steps which do not affect each other.

Where only vertical channel-type devices are fabricated, the order in which the doping processes are carried out presents no serious problems. However, if doping is done between the steps (2) and (4), the side surfaces of the elevated portions where channels should be formed might be doped. Therefore, the doping is preferably done after the processing step (4). If planar MOSFETs are formed at the same time, the doping is preferably carried out after the end of the processing step (9). Thus, the source and drain regions of the planar MOSFETs can be self-aligned to the gates.

While the novel fabrication process of the present invention has been described thus far as related to general cases, special cases are next described. A NAND-type nonvolatile memory is a promising application of the present invention. Where the novel fabrication process is applied to this NAND-type nonvolatile memory, care must be paid to device isolation technology. The technique of the above-cited Japanese Patent Unexamined Publication No. 13627/1994 is not limited to a NAND circuit. The NAND circuit has the disadvantage that ground lines must be laid parallel to the bit lines. However, the number of contacts to the top layer of metallization (in the case of a NAND circuit, bit lines and ground lines) per memory cell can be reduced.

In an ordinary NAND circuit, each individual memory block is composed of four or more, preferably eight or more, memory cells, or memory transistors. Each block is equipped with 2 selecting transistors. There exists one contact which brings the bit line into contact with the source of each selecting transistor, i.e., there are 2 contacts per block. The number of the contacts per block can be reduced to 1 by making any two adjacent blocks share a common contact. Where each block is composed of 4 or 8 memory cells, the number of the contacts per memory cell is ¼ or ⅛, respectively. On the other hand, in a normal matrix memory circuit, ground lines can be formed on a substrate and so the top layer of metallization can be formed into only bit lines, but at least one contact is necessary for each one memory cell. In this way, increasing the number of contacts makes it difficult to realize a higher device density.

The application of the present invention to a NAND circuit starts with the processing step (1), i.e., device isolation. During this processing step, an insulator used for the device isolation is required to be buried in a direction parallel to the bit lines. During the step (2), it is necessary to form trenches (i.e., linear elevated portions) parallel to the word lines. Let D be the depth of the insulator used for the device isolation in the processing step (1). Let d be the etch depth during the process step (2). The following relation must be met:

$$D-d>0$$

This means that the bottom of the insulator is located deeper than the etching depth; otherwise device components would be coupled together in the direction of the word lines through the trenches formed by the processing step (2).

The device isolation is required for each bit line. Therefore, the insulator for the isolation used for the process step (1) is defined at regular intervals according to each bit line. In the present invention, two devices are formed per linear elevated portion and so two word lines are formed per linear elevated portion. Since the word lines intersect the bit lines, the insulator intersects the linear elevated portions or trenches.

In the NAND circuit, selecting transistors which are normal transistors having no floating gates must be formed at the same time. In the present invention, this requirement poses no problems. For example, if vertical-channel type selecting transistors are fabricated, the first conductive film is fully removed from the portions where the selecting transistors should be formed in the process step (5). Accordingly, any extra step is not needed to form the selecting transistors. If planar MOSFETs are used as the selecting transistors, these MOSFETs all become normal transistors having no floating gates because the first conductive film is etched off from the portions where the planar MOSFETs are formed, by the step (6). The planar MOSFETs are fabricated by a method described later.

Where the NAND circuit is composed of selecting transistors consisting of vertical-channel MOSFETs, the cross-section of the portion around the selecting transistors take the following shape, it being noted that details of the shape are described in Embodiment 2. Each selecting transistor is formed on a second elevated portion. Each memory cell is formed on first and third elevated portions. It is assumed that the first, second, and third elevated portions are arrayed in this order from the left. In this memory block, the right and left halves which are located on opposite sides of the second elevated portion are different from each other. A floating gate exists on the side surface of each of the first and third elevated portions. No floating gate resides on the second elevated portion.

Of course, a gate (in the case of a selecting transistor) or control gate (in the case of a memory cell) is present on each side surface of the elevated portions. Obviously, floating gates, gates, or control gates are formed by anisotropic etching.

Of course, the floating gates in one memory cell are electrically isolated from the floating gates in other memory cells. An interlayer insulator plates out on these elevated portions, control gates, and gates. Furthermore, bit lines and ground lines extending so as to intersect the control gates and gates are formed on the interlayer insulator.

The NAND circuit is characterized in that the bit lines and ground lines make contact not with the first and third elevated portions but with the second elevated portion on which the selecting transistors are formed. Similar memory cells exist on the left side of each first elevated portion and the right side of each third elevated portion. The elevated portions of selecting transistors of a structure similar to the second elevated portions form one memory block.

The whole memory matrix is constructed as described below. Two kinds of elevated portions are found on a cross section vertical to the word lines; one kind has a floating gate, while the other kind has no floating gate and constitutes a selecting transistor. Either kind has a gate or control gate. An interlayer insulator plates out on these elevated portions, control gates, or gates. Bit lines and ground lines are formed on this interlayer insulator. The bit and ground lines make contact with the latter elevated portions but not with the former elevated portions.

Where a semiconductor device is fabricated by making use of the present invention, some devices may be required to be fabricated by the conventional planar technology. In the present invention, in principle, the second conductive film is fully etched away, excluding the side surfaces of the elevated portions. Therefore, it is difficult to bring the control gates into contact with the top layer of metallization unless any appropriate measure is taken. In consequence, after the processing step (8), a process step for selectively masking the second conductive film is performed.

After this step (8), if the anisotropic etching of the step (9) is carried out, these masked portions are not etched away. More specifically, as a result of the process step (9), the side surfaces of the elevated portions or the unmasked portions of second conductive film are etched away. The gates and conductive interconnects of the planar MOSFET and the contact-forming portions at the ends of the control gates should be masked.

The source and drain of the planar MOSFET are formed after the formation of the gate, i.e., after the processing step (9). Where the planar MOSFET is formed in the portion etched by the processing step (2), the following requirement must be satisfied:

$$D-d>\delta$$

where D is the depth of the insulator for device isolation used by the step (1), $\delta$ is the effective depth of the source and drain, and d is the etch depth achieved by the step (2). This means that in a portion formed by the step (2), the bottom of the insulator is located deeper than the bottoms of the source and drain; otherwise the bottoms of the source and drain would become deeper than that of the insulator, making it impossible to isolate the individual device components.

Irrespective of the location where planar MOSFET is formed, the following requirement must be met:

$$d>\delta$$

Otherwise, the impurities would diffuse even below the elevated portions, thus making it substantially impossible to form the vertical channel.

Where a planar MOSFET is fabricated in addition to a vertical-channel device, one photolithography step is added. An example of circuit fabrication by this method is described in Embodiment 3. In processing step (6), the first conductive film formed on a plane is fully etched away unless the film is masked. Therefore, floating gates cannot be formed on the planar MOSFET.

Another method of fabricating a planar MOSFET is characterized in that a processing step for selectively masking the first conductive film is performed between the processing steps (4) and (5). In this case, the steps (5) and (6) cannot be interchanged in order. In this method, the gates and conductive interconnects of the planar MOSFET can be fabricated from the first conductive film. In practice, however, the gate interconnects of planar MOSFETs (which are mainly in the peripheral circuit) and the control gates of a memory are preferably made from the same film. Because of problems with the contacts of the control gates to the top layer of metallization, the above-described additional processing step makes it difficult to form a contact region.

In this case, a doping step may be carried out at any time if the processing step (6) has been already performed. As a result of the step (9), sidewalls are formed on the side surfaces of the gates and interconnects of the planar MOSFET. Utilizing this, a double drain can be formed by performing a doping step with two different doses. An example of circuit fabrication by this method is described in Embodiment 4.

A further method of fabricating a semiconductor device according to the invention has the following processing steps:

(11) etching the semiconductor substrate to form elevated portions;

(12) forming an insulating film on exposed surface portions of the semiconductor substrate;

(13) forming a first conductive film;

(14) anisotropically etching the first conductive film to form film portions on side surfaces of the elevated portions which will become floating gates;

(15) forming an insulating film on surfaces of the floating gates;

(16) selectively oxidizing the semiconductor substrate and/or the first conductive film to obtain an oxide for device isolation;

(17) forming a second conductive film;

(18) selectively masking the second conductive film; and

(19) anisotropically etching the second conductive film to form control gates on side surfaces of the elevated portions so as to cover the floating gates and, at the same time, to obtain gates for planar MOSFETs.

The processing step (16) may be performed either between the steps (13) and (14) or between the steps (14) and (15). The doping step for diffusing dopants that impart one conductivity type is performed preferably after the step (19). Thus, the source and drain (or impurity regions) of the planar MOSFET can be self-aligned to the gate. In order to obtain multilevel metallization in the same way as in the prior art technique, an interlayer insulator is deposited after the processing step (19), and the top layer of metallization may be deposited.

During the step (16), LOCOS or its technical extension may be exploited. In the processing steps (12) and (15), the insulating films may be formed by thermal oxidation, thermal nitridation, or CVD.

The first conductive film formed by the processing step (13) becomes floating gates after the etching step (14). Generally, as a result of the anisotropic etching of the step (14), the first conductive continuous film is left on one side surface of each elevated portion.

If plural devices should be formed on each one side surface, it is necessary to isolate the floating gates of one device from the floating gates of other devices. For this purpose, the processing step (16) is carried out to form an oxide for the device isolation and also to isolate the floating devices of one device from the floating devices of other devices.

As mentioned previously, the processing step (16) may be performed either between the steps (13) and (14) or between the steps (14) and (15). Each case is now discussed briefly. Where the step (16) is effected between the steps (13) and (14), the oxide for the device isolation first separates the first film, followed by the execution of the step (14) to form the floating gates on the side surfaces of the elevated portions. As a result, the floating gates of one device is separated from the floating gates of the adjacent device.

Where the step (16) is effected between the steps (14) and (15), selective oxidation brings an oxidation mask (usually made from silicon nitride) into direct contact with the semiconductor substrate and with the first conductive film and, therefore, there is the possibility that peeling takes place. However, this scheme is not unfeasible. For these reasons, the step (16) may be performed either between the steps (13) and (14) or between the steps (14) and (15).

While the novel fabrication process of the present invention has been described thus far as related to general cases, special cases are next described. A NAND-type nonvolatile memory is a promising application of the present invention. Where the novel fabrication process is applied to this NAND-type nonvolatile memory, care must be paid to device isolation technology. The technique of the above-cited Japanese Patent Unexamined Publication No. 13627/1994 is not limited to a NAND circuit. The NAND circuit has the advantage that the number of contacts to the top layer of metallization (in the case of a NAND circuit, bit lines; if necessary, ground lines are also included) per memory cell can be reduced compared to the prior art matrix circuit.

In a normal NAND circuit, each memory block is composed of 4 or more, preferably 8 or more, memory cells, or memory transistors, which are connected in series. At least two selecting transistors are arranged on opposite sides of each memory cell in each block. The source of each selecting transistor makes contact with each bit line at one location. That is, two contacts exist per block. The number of the contacts per block can be reduced to 1 by making any two adjacent blocks share a common contact. Where each block is composed of 4 or 8 memory cells, the number of the contacts per memory cell is ¼ or ⅛, respectively.

On the other hand, in a normal matrix memory circuit, each memory cell needs at least one contact. In this way, increasing the number of contacts makes it difficult to realize a higher device density.

In order to apply the present invention to a NAND circuit, the processing step (16) is first required to form plural kinds of oxides for device isolation in a direction substantially vertical to the word lines. Of course, in the process step (11), trenches are required to be formed parallel to the word lines. That is, linear elevated portions are necessitated.

The device isolation is not necessary between the memory cells connected in series or between the selecting transistors connected in series while it is necessary between the other transistors. During the step (16), the insulator for the device isolation is defined at regular intervals for the transistor arrays. In the present invention, two devices are formed on the side surfaces of each linear elevated portion. Therefore, two word lines are formed for one linear elevated portion. Since the word lines intersect the transistor arrays, the insulator for the device isolation intersects the linear elevated portions or trenches.

In the NAND circuit selecting transistors which are normal transistors having no floating gates are necessary, together with memory cells. In the present invention, planar MOSFETs are used as the selecting transistors. Since those portions of the first conductive film on which the planar MOSFETs are fabricated are etched away by the step (14), all the planar MOSFETs become normal transistors having no floating gates.

It is necessary that the impurity regions of each selecting transistor contact the bit lines and ground lines. Where the selecting transistors are formed on the surfaces of the elevated portions, contact holes can be formed more advantageously than where the transistors are formed in trenches. A method of fabricating the planar MOSFETs is described later.

By making the selecting transistors the planar type, the formation of contacts on the elevated portions where vertical-channel devices are fabricated is dispensed with. This yields the following advantages. The width of the elevated portions where no contacts are required is designed with the minimum design rules. If contacts were necessary, its width would be at least twice as large as the minimum design rules.

Where semiconductor devices are fabricated, utilizing the present invention, some devices may be required to be fabricated in the peripheral circuit, by the conventional planar technology, as well as the selecting transistors. In the present invention, in principle, the second conductive film is fully etched away, excluding the side surfaces of the elevated portions. Therefore, it is difficult to bring the control gates into contact with the top layer of metallization unless any appropriate measure is taken. For this purpose, the processing step (18) is necessitated.

Following this step, if anisotropic etching of the step (19) is performed, then the masked portions are not etched. In particular, as a result of the step (19), the second conductive film, excluding the side surfaces of the elevated portions or the masked portions, is etched off. The gates and conductive interconnects of the planar MOSFET and the contact-forming portions at the ends of the control gates should be masked.

The source and drain of the planar MOSFET are formed after the formation of the gate, i.e., after the processing step (19). The doping step must satisfy the following requirement:

$$d > \delta$$

where d is the etch depth achieved by the step (11) and $\delta$ is the effective depth of the source and drain.

Otherwise, the impurities would diffuse even below the elevated portions, thus making it substantially impossible to form the vertical channel.

Where a planar MOSFET is manufactured other than the vertical channel-type device in this way, one photolithography step is added. In the processing step (14), the first conductive film formed on a flat plane is fully etched away unless any mask is placed. Consequently, it is impossible to form floating gates on the planar MOSFET.

Other objects and features of the invention will appear in the course of the description thereof, which follows.

BRIEF DESCRIPTION OF THE DRAWINGS

FIGS. 1(A)–1(E) and 2(A)–2(E) are cross-sectional views of a semiconductor device for Embodiment 1;

FIG. 3 is a top view of the semiconductor device shown in FIGS. 1(A)–1(E) and 2(A)–2(E);

FIGS. 10(A)–10(H) are cross-sectional views of a semiconductor device for Embodiment 4;

DETAILED DESCRIPTION OF THE PREFERRED EMBODIMENTS

Embodiment 1

Figure 4A:
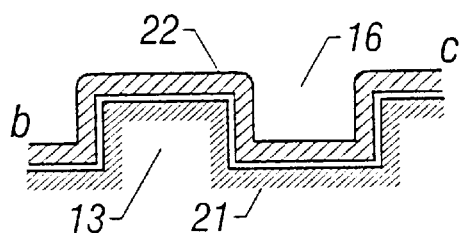
FIGS. 4(A)–4(F) are cross-sectional views of a semiconductor device for Embodiment 1.
Figure 4B:
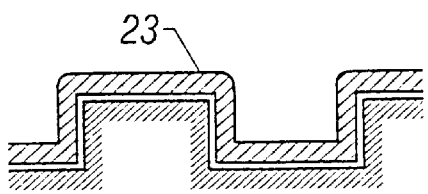
Figure 4C:
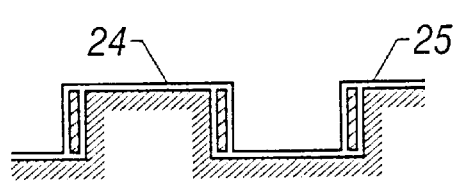
Figure 4D:
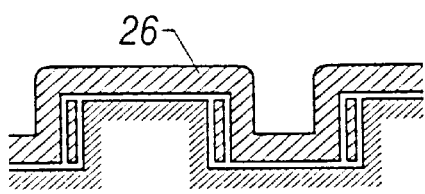
Figure 4E:
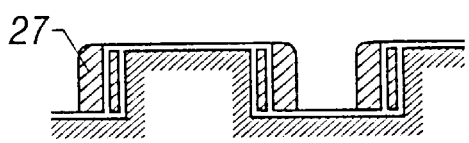
Figure 4F:
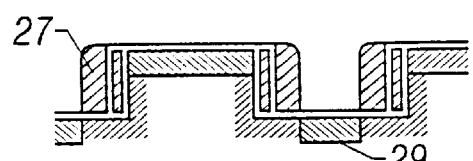
Figure 5A:
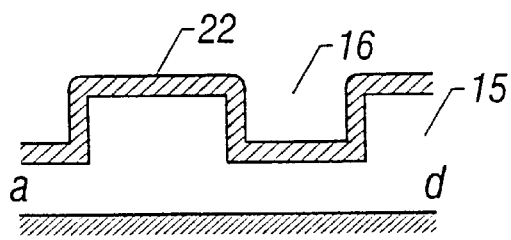
FIGS. 5(A)–5(D) are cross-sectional views of a semiconductor device for Embodiment 1.
Figure 5B:
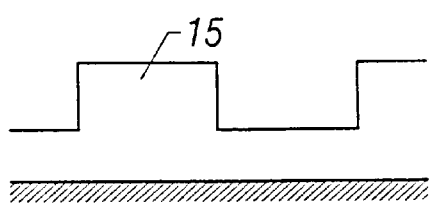
Figure 5C:
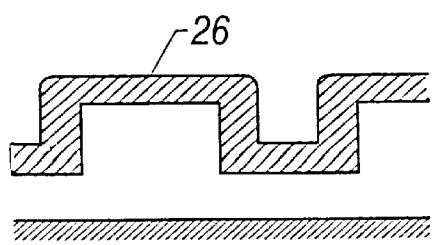
Figure 5D:
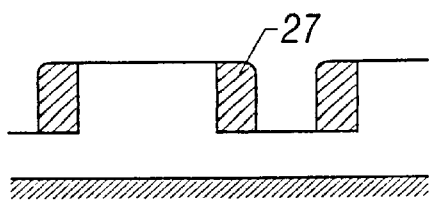
Figure 6A:
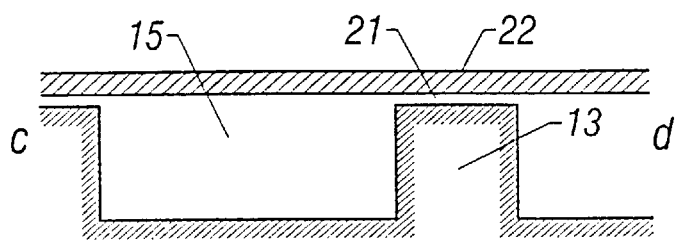
FIGS. 6(A)–6(F) are cross-sectional views of a semiconductor device for Embodiment 1.
Figure 6B:
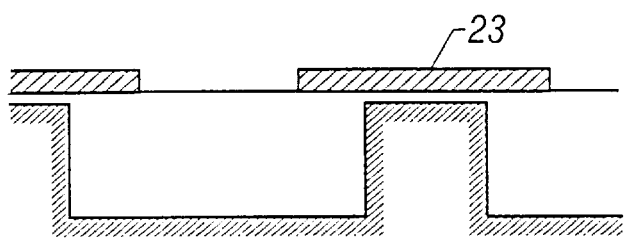
Figure 6C:
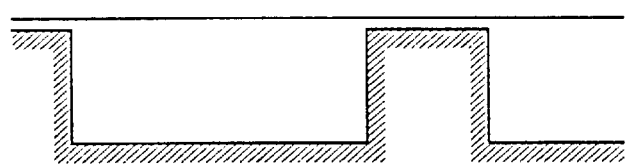
Figure 6D:
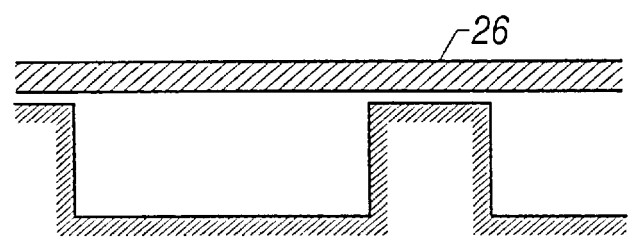
Figure 6E:
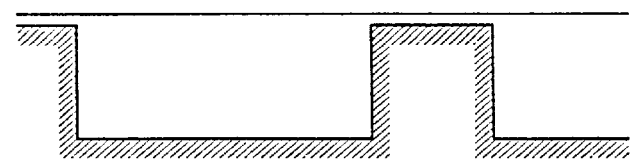
Figure 6F:
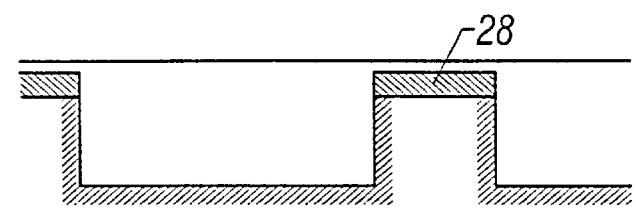
Figure 7A:
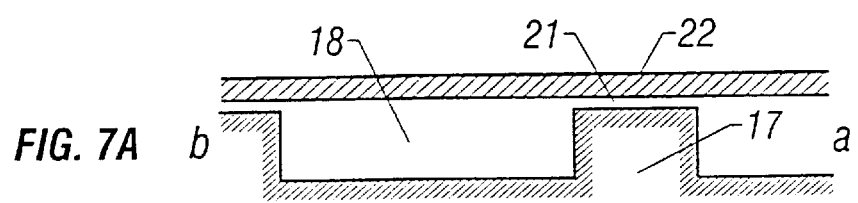
FIGS. 7(A)–7(F) are cross-sectional views of a semiconductor device for Embodiment 1.
Figure 7B:
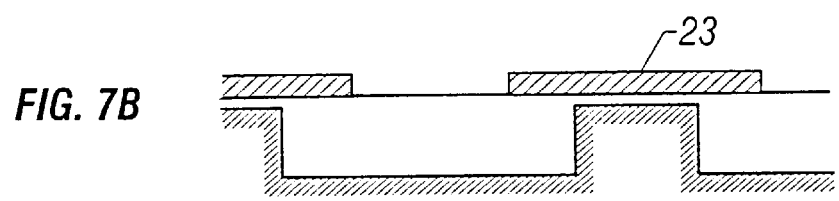
Figure 7C:
Figure 7D:
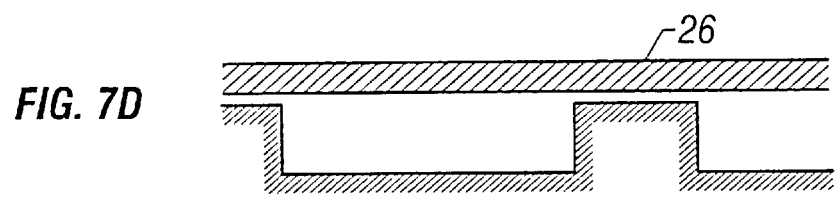
Figure 7E:
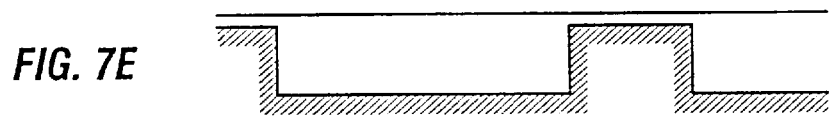
Figure 7F:
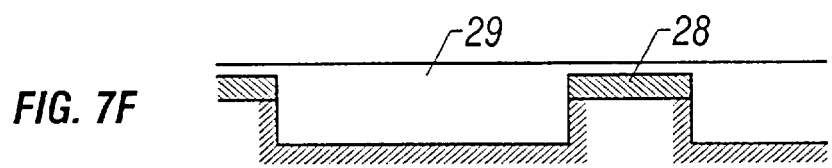

One embodiment of the present invention is shown in FIGS. 1(A)–7(F). The present embodiment is intended to illustrate the principles of a method for fabricating a non-volatile memory device in accordance with the present invention. In the present embodiment, trench isolation technology is used to provide device isolation. First, as shown in FIG. 1(A), a plurality of first trenches 12 are formed in a semiconductor substrate. Excluding the first trenches 12, the height is the same as the height of the native surface of the semiconductor substrate. To clearly show the interface with the semiconductor substrate, the interface and surface are indicated by hatching. This does not means, however, that these portions differ from other portions in composition, conductivity, and other properties.

In the following description, the height of the surface of the native semiconductor substrate is indicated by the arrow 11. The depth of the first trenches are 1.3 to 3 times (preferably 1.6 to 2) times the height of the vertical-channel device (elevated portions), i.e., the depth of second trenches (described later). For example, if devices having a channel length of 0.3 $\mu$m are fabricated, the height of the vertical-channel devices is 0.3 $\mu$m. Therefore, the depth of the trenches 12 is 0.39 to 0.9 $\mu$m, preferably 0.48 to 0.6 $\mu$m (FIG. 1(A)).

Then, an insulating film 14 of BPSG (borophosphosilicate glass) is deposited. It is necessary that this film be thick enough to fill up the first trenches (FIG. 1(B)).

The insulating film 14 is etched back by a well-known etchback method to expose the native semiconductor substrate surface, thus planarizing the surface. As a result, the first trenches 12 are filled with an insulator 15 (FIG. 1(C)).

FIG. 1(E) is a top view of this structure. That is, the first trenches 12 are formed in the direction indicated by the line B–B'. FIGS. 1(A)–1(D) are cross-sectional views taken on lines C–C' and D–D' of FIG. 1(E).

For the planarization step, CMP may be used instead of the above-described etchback. CMP provides a smoother surface (FIG. 1(D)). The processing steps described thus far represent the processing step (1) above.

Then, new, second trenches 16 and elevated portions are formed in a direction (indicated by D–D') substantially vertical to the first trenches 12. The depth of the second trenches 16 is closely related to the channel length of the vertical-channel devices formed as described above. This state is shown in FIG. 2(E).

FIGS. 2(A), 2(B), 2(C), and 2(D) are cross sections taken on lines A–A', B–B', C–C', and D–D', respectively, of FIG. 2(E). Again, the height of the surface of the native semiconductor substrate is indicated by the arrow 11. In the cross section taken on line B–B' of FIG. 2(B), the surface is covered with the insulator 15 to provide device isolation. Accordingly, in the NAND circuit, bit lines are arranged parallel to the line B–B'.

It is to be noted that the elevated portions include the native semiconductor surface 13 (FIG. 2(A)) and the insulator (FIG. 2(B)). In the cross sections which are taken on the lines C–C' (FIG. 2(C)) and D–D' (FIG. 2(D)) and are parallel to the second trenches 16, substantially no irregularities exist. In the cross section taken on the line D–D' (FIG. 2(D)), a major portion of the insulator 15 has been erased, thus forming an insulator 18. A semiconductor surface 17 is lower than the native substrate surface 11. These processing steps represent the step (2) above (FIGS. 2(A)–2(D)).

A rectangle abcd is shown in FIG. 3. The sides of this rectangle are shown in cross section, together with successive processing steps. The cross section of bc is shown in FIGS. 4(A)–4(F). The cross section of ad is also shown in FIGS. 5(A)–5(D). The cross section of cd is shown in FIGS. 6(A)–6(F). The cross section of ab is shown in FIGS. 7(A)–7(F).

First, an oxide film 21 is formed by thermal oxidation or other well-known method on the semiconductor surface formed as described above. This represents the processing step (3) above.

Then, a first conductive film 22 is formed from a semiconductor material or the like by a well-known film formation technique. This represents the step (4) above. It is necessary that this film formation technique provide excellent step coverage such that the sidewalls of the second trenches 16 are covered sufficiently. Preferably, the thickness of the film is ⅕ to ½ of the depth of the second trenches. The state obtained thus far is shown in the cross sections of FIGS. 4(A), 5(A), 6(A), and 7(A).

Figure 11A:
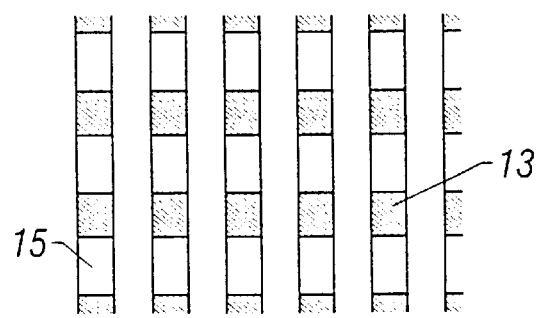
FIGS. 11(A)–11(F) are cross-sectional views of a semiconductor device for Embodiment 5.
Figure 11B:
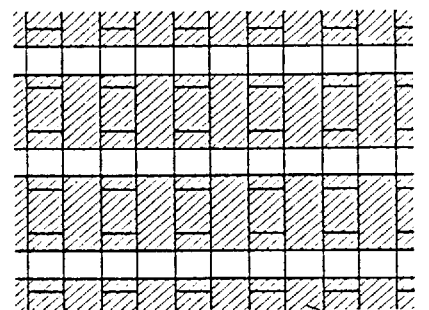

Thereafter, the first conductive film 22 is selectively etched by a well-known photolithography method and a well-known isotropic etching method, thus giving rise to an etched film 23. This step represents the step (5) above. That is, only those portions (e.g., indicated by the lines B–B' in FIGS. 1(E), 2(E), and 3) which are required to isolate individual floating gates are etched away. The resulting state is shown in the cross sections of FIGS. 4(B), 5(B), 6(B), and 7(B). FIG. 11(B) is a top view illustrating this state. FIG. 11(A) is similar to FIG. 2(E). The first conductive film 22 is etched into stripes in the direction indicated by the line B–B' in FIGS. 1(E), 2(E), and 3, so that the film 23 is obtained.

Then, the film 23 is etched by a well-known anisotropic etching method. This process step represents the step (6) above. As a result, floating gates 24 are left behind only on the side surfaces of the elevated portion; the other portions are etched away. An insulating film 25 is formed on the surfaces of the floating gates 24 by thermal oxidation or other well-known film formation technique. This step represents the step (7) above. The state obtained thus far is shown in the cross sections of FIGS. 4(C), 6(C), and 7(C). With respect to the cross section of ad, the state is the same as the state shown in the cross section obtained by the previous processing step, i.e., FIG. 5(B).

Subsequently, a second conductive film 26 is formed from a semiconductor or metallic material by a well-known film formation technique. This fabrication step represents the step (8) above. Also in this case, the technique must have excellent step coverage. Preferably, the thickness of this film is ⅕ to ½ of the depth of the second trenches. The obtained state is shown in the cross sections of FIGS. 4(D), 5(C), 6(D), and 7(D).

Thereafter, the second conductive film 26 is etched by a well-known anisotropic etching method. This processing step represents the step (9) above. As a result, control gates 27 are left on the side surfaces of the elevated portions; the other portions are etched away. As clearly shown in the cross section of bc, the control gates 27 reside on the floating gates 24, respectively. The control gates 27 are formed along the trenches 16. This state is shown in the cross sections of FIGS. 4(E), 5(D), 6(E), and 7(E).

Then, impurity regions are formed by ion implantation or other well-known dopant diffusion technique. As a result, an impurity region 28 is formed on the top 13 of each elevated portion. An impurity region 29 is formed at the bottom of each second trench 16. This state is shown in the cross sections of FIGS. 4(F), 6(F), and 7(F). With respect to the cross section of ad, the state is the same as the state shown in the cross section of FIG. 5(B) obtained by the previous processing step, In this way, memory cells of a nonvolatile memory devices can be formed.

Embodiment 2

The process sequence of the present embodiment is now described by referring to FIGS. 8(A)–8(H) which are taken on the line A–A' of FIGS. 1(E), 2(E), and 3. The cross sections taken on the lines B–B', C–C', and D–D' are similar to the cross sections of FIGS. 5–7.

In the present embodiment, the structure of a NAND-type nonvolatile memory device and the arrangements of its components are described. First, trenches are formed in a semiconductor device in which an insulator 15 is buried. Three elevated portions 31–33 are formed (FIG. 8(A)).

Figure 8A:
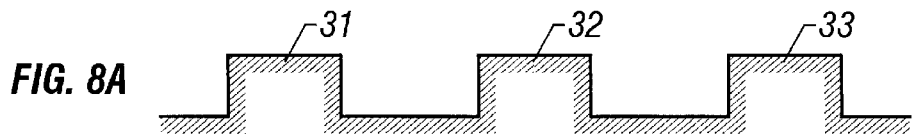
FIGS. 8(A)–8(H) are cross-sectional views of a semiconductor device for Embodiment 2.
Figure 8B:
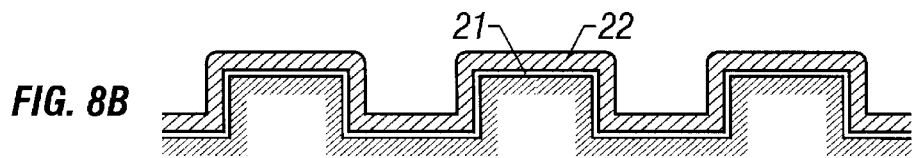

An oxide film 21 is formed on the semiconductor surface by thermal oxidation or other well-known method. A first conductive film 22 is formed from a semiconductor material or the like, using a well-known film formation technique. The state obtained thus far is shown in FIG. 8(B). Other cross sections are similar to FIGS. 5(A), 6(A), and 7(A) (FIG. 8(B)).

Figure 8C:
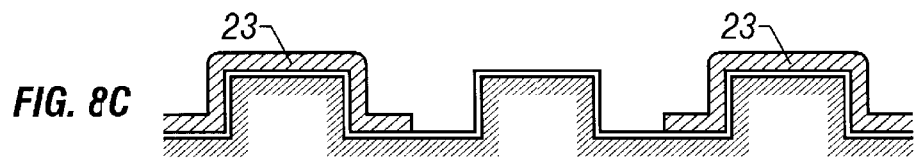

Then, even the first conductive film 22 lying on the portion around the central elevated portion 32 is selectively etched by a well-known photolithography method and well-known isotropic etching method. Thus, an etched film 23 is obtained. That is, in the present embodiment, those portions on which selecting transistors should be formed are selectively etched away, as well as the portions (e.g., indicated by the line B–B' in FIGS. 1(E), 2(E), and 3) for isolating the individual floating gates as described previously in Embodiment 1. This state is shown in FIG. 8(C). Other cross sections are similar to FIGS. 5(B), 6(B), and 7(B) (FIG. 8(C)).

Figure 8D:

The film 23 is etched by a well-known anisotropic etching method, leaving only the floating gates 24 on the side surfaces of the elevated portions 31 and 33; the other portions are etched away. This state is shown in FIG. 8(D) (FIG. 8(D)).

Figure 8E:
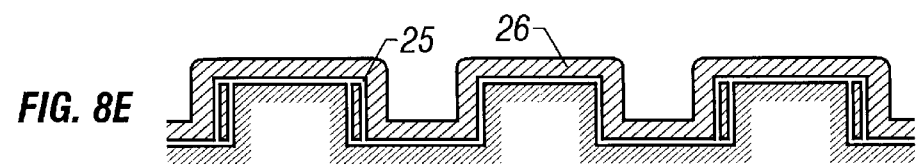

An insulating film 25 is formed on the surface of each floating gate 24 by thermal oxidation or other well-known film formation technique. A second conductive film 26 is formed from a semiconductor or metallic material by a well-known film formation technique. The resulting state is shown in FIG. 8(E). Other cross sections are similar to the cross sections of FIGS. 5(C), 6(D), and 7(D) (FIG. 8(E)).

Figure 8F:
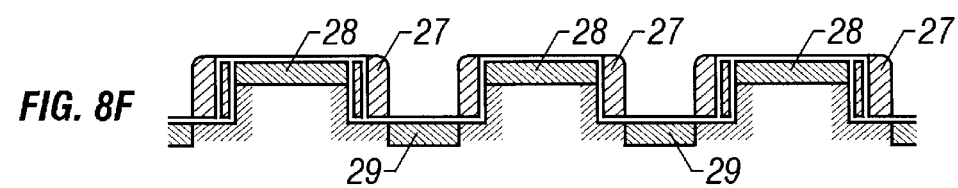
Figure 8G:
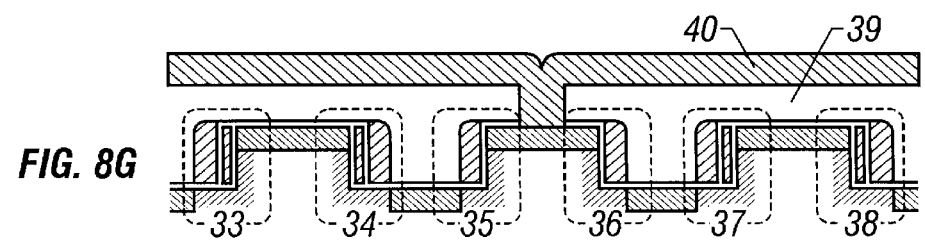

Then, the second conductive film 26 is etched by a well-known anisotropic etching method. As a result, control gates 27 are left on the side surfaces of the elevated portions 31–33; the other portions are etched away. Impurity regions are formed by ion implantation or other well-known dopant diffusion method. As a result, an impurity region 28 is formed on the top of each elevated portion. Also, an impurity region 29 is formed at the bottom of each trench 16. This state is shown in FIG. 8(F). Other cross sections are similar to the cross sections of FIGS. 6(F) and 7(F) (FIG. 8(F)).

Thereafter, an interlayer insulator 39 is deposited by a well-known technique. A contact hole extending to the elevated portion 32 is formed. A top layer of metallization 40 for forming bit lines and ground lines (ground lines in this embodiment) is built up. In this way, selecting transistors 35, 36 and memory cells 33, 34, 37, 38 can be built (FIG. 8(G)).

Figure 8H:
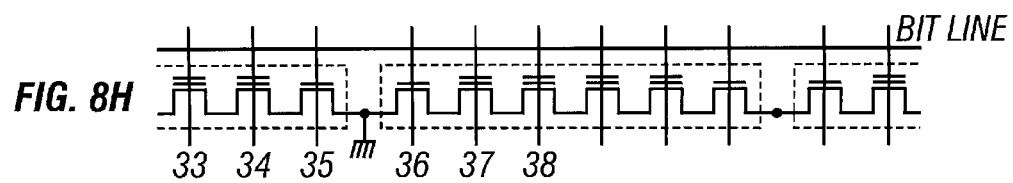

The resulting circuit is shown in the circuit diagram of FIG. 8(H). Surrounded by the dotted lines are memory blocks. In each memory block, two selecting transistors and 4 memory cells are formed. The elevated portion 32 forms an interface between two adjacent blocks (FIG. 8(H)). In this way, a nonvolatile memory device can be completed.

Embodiment 3

The present embodiment is described by referring to FIGS. 9(A)–9(G). The present embodiment pertains to a technique for fabricating a planar MOSFET and a vertical-channel transistor on the same substrate. First, a device isolating insulator 18 is buried in a semiconductor substrate, which is then etched to form an elevated portion 13 (FIG. 9(A)).

Then, the semiconductor surface is oxidized by thermal oxidation to form an oxide film 21. Also, a film 22 of a semiconductor material is deposited (FIG. 9(B)).

Figure 9A:
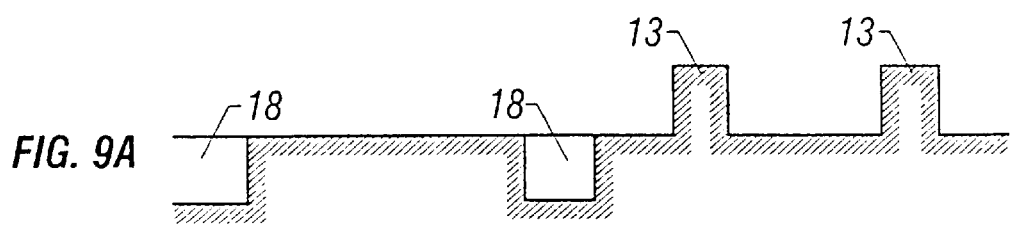
FIGS. 9(A)–9(G) are cross-sectional views of a semiconductor device for Embodiment 3.
Figure 9B:
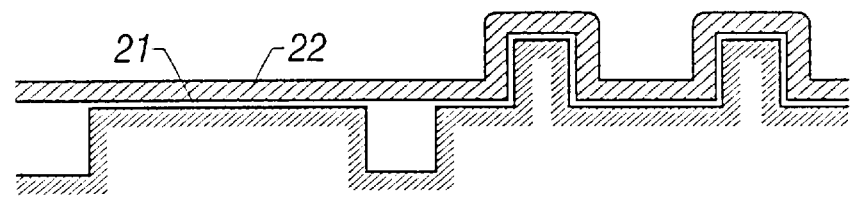
Figure 9C:
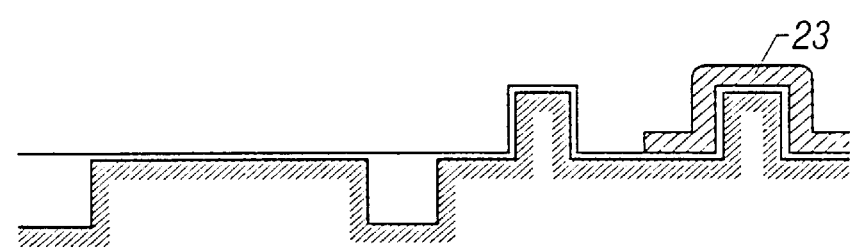
Figure 9D:
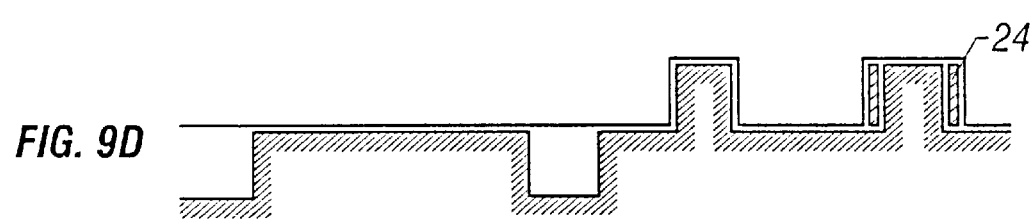
Figure 9E:
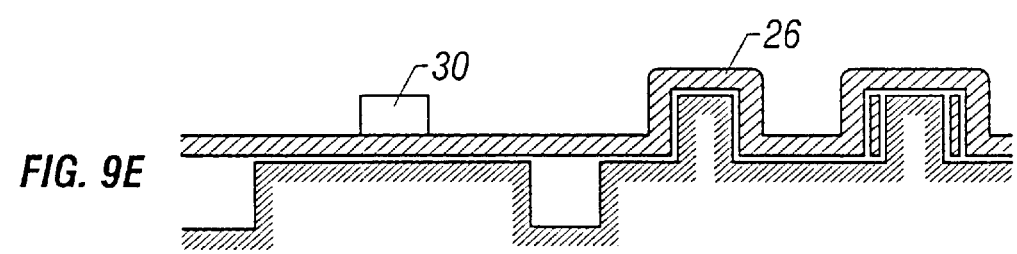
Figure 9F:
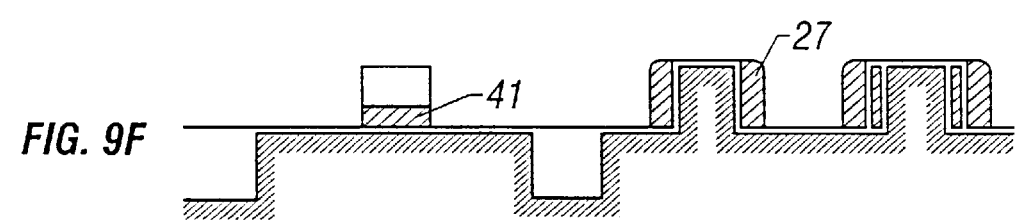

The semiconductor film 22 is isotropically etched while leaving a semiconductor film 23 only on those portions where floating gates should be formed (FIG. 9(C)).

A floating gate 24 is formed on each elevated portion by a well-known anisotropic etching method. The surface is thermally oxidized to form a thermal oxide film (FIG. 9(D)).

Then, a semiconductor film 26 is formed. A mask 30 is formed by a well-known photolithography method on those portions which will become gates of planar MOSFETs and conductive interconnects (FIG. 9(E)).

Subsequently, the semiconductor film 26 is etched by a well-known anisotropic etching method. As a result, the film is etched away, excluding the side surfaces of the elevated portions and the masked portions, 30. Control gates and gates 27 are formed on the side surfaces of the elevated portions. Gates 41 of the planar MOSFETs are formed on the portions covered with the mask 30 (FIG. 9(F)).

Figure 9G:
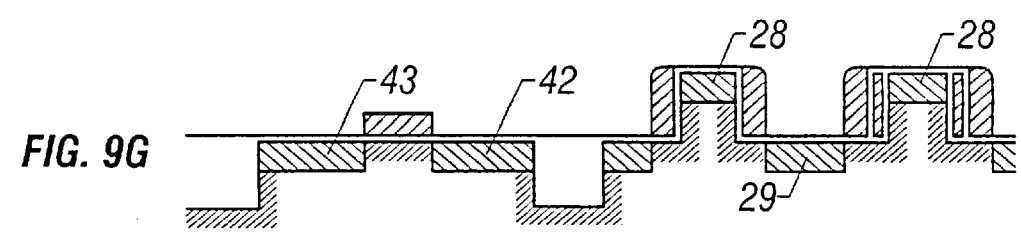

Finally, dopants are diffused by a well-known ion implantation method to form impurity regions including the source 42 and drain 43 of each planar MOSFET (FIG. 9(G)).

Embodiment 4

The present embodiment is described by referring to FIGS. 10(A)–10(H). The present embodiment pertains to a technique for fabricating planar MOSFETs and vertical-channel transistors on the same substrate. First, a device isolating insulator 18 is buried in a semiconductor substrate by a technique which is substantially the same as used in Embodiment 1. The substrate is etched to form elevated portions 13 (FIG. 10(A)).

Then, the semiconductor surface is thermally oxidized to form an oxide film 21. Also, a film of a semiconductor material is formed. Those portions on which floating gates should be formed are etched away by a well-known photolithography method and a well-known isotropic etching technique. A mask 44 is formed by a well-known photolithography method on those portions of the remaining film 23 on which the gates of the planar MOSFETs and conductive interconnects are formed (FIG. 10(B)).

Subsequently, a floating gate 24 is formed on each elevated portion by a well-known anisotropic etching method. The gates 45 of planar MOSFETs are formed on the masked portions (FIG. 10(C)).

The surface is thermally oxidized to form an oxide film 25 (FIG. 10(D)).

Then, a semiconductor film 26 is formed (FIG. 10(E)).

The semiconductor film 26 is etched by a well-known anisotropic etching method. As a result, the film is etched away, excluding the side surfaces of the elevated portion and the side surfaces of the previously formed gates and conductive interconnects of the planar MOSFETs. Control gates 27 are formed on the side surfaces of the elevated portions. Sidewalls 46 are formed on the side surfaces of the gates 45 of the planar MOSFETs. Although the sidewalls 46 exhibit a conductivity, they are not intentionally maintained at a given electric potential (FIG. 10(F)).

Finally, impurities are diffused by a well-known ion implantation method to form impurity regions, including the sources 42 and drains 43 of the planar MOSFETs. In this embodiment, offsets are created between the source/drain and the gate of each planar MOSFET (FIG. 10(G)).

A double-implant lightly doped drain (DI-LDD) structure can be formed by a similar technique. At this time, after the processing step shown in FIG. 10(C), dopants are implanted at a low concentration. Then, after the fabrication step shown in FIG. 10(F), dopants are introduced at a high concentration. A cross section of a device having the double-implant lightly doped drain (DI-LDD) structure obtained in this way is shown in FIG. 10(H). The planar MOSFET has a typical double-implant lightly doped drain (DI-LDD) structure. Even in the vertical-channel device, one of the source and drain assumes a double-implant lightly doped drain (DI-LDD) structure (FIG. 10(H)).

Embodiment 5

The present embodiment is described by referring to FIGS. 11(A)–11(F). In this embodiment, the present invention is applied to a multilevel NAND-type nonvolatile memory device as proposed by Aritome et al. in IEDM 95-275, Washington, Dec. 10–13, 1995. This memory device is shown in the circuit diagram of FIG. 11(F), where the dotted lines indicate memory blocks. Unlike the prior art NAND circuit, memory cells and ordinary transistors are connected in parallel between two selecting transistors in each block.

Apparently, the number of transistors per block increases. The difference between a memory cell and a normal transistor is whether the device has a floating gate or not. In each one MOSFET, it suffices to adjust the position and size of the floating gate. Hence, this approach is not detrimental to the packing density at all.

Figure 11C:
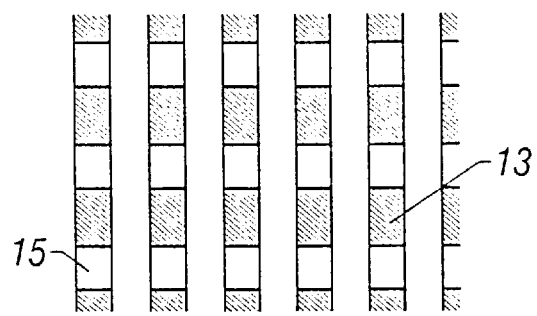
Figure 11D:
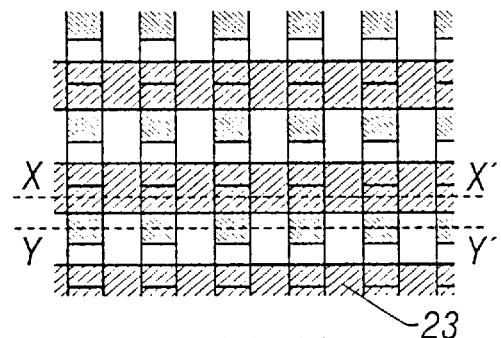
Figure 11E:
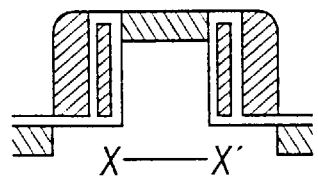
Figure 11F:
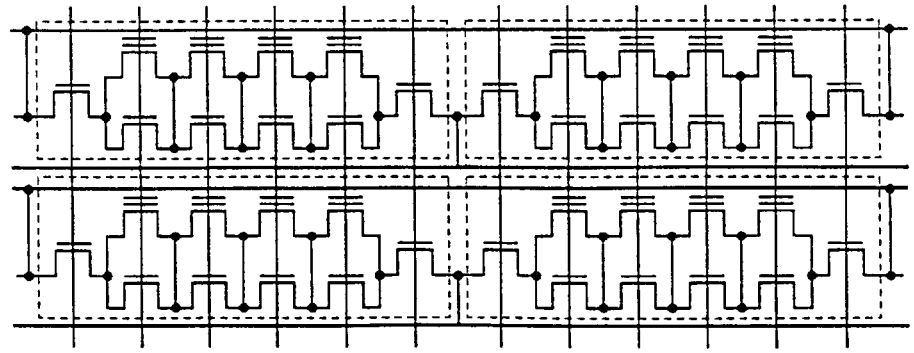

For example, in the present invention, after a structure (corresponding to the structure shown in FIG. 2(E)) having the elevated portions 13 and insulator 15 on the semiconductor substrate shown in FIG. 11(C) is built, the first conductive film 22 is formed and etched as shown in FIG. 11(D). For comparison, an etching pattern which is used for the first conductive film 22 when the prior art NAND circuit is manufactured is shown in FIG. 11(B). By performing the etching as shown in FIG. 11(D), a floating gate is formed on the cross section X–X', but no floating gate is formed on the cross section Y–Y', as shown in FIG. 11(E). Since these two cross sections are parallel, a circuit shown in FIG. 11(F) can be obtained.

Embodiment 6

The present embodiment is shown in FIGS. 12(A)–12(I). This embodiment illustrates the principles of a method of fabricating a semiconductor device such as a nonvolatile memory device by making use of the present invention. Typically fabricated three portions are shown in the cross sections of FIGS. 12(A)–12(I). In each of these figures, a portion on which a planar device is fabricated, a portion on which a device isolating oxide is deposited, and a portion on which a vertical-channel device is fabricated are arranged in this order from the left.

Figure 12A:
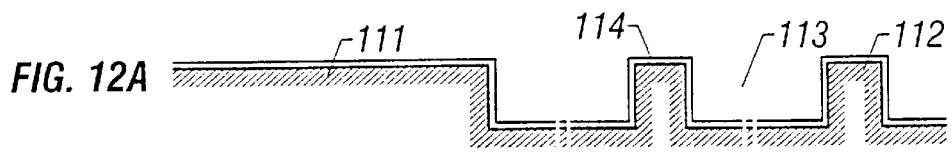
FIGS. 12(A)–12(I) are cross-sectional views of a semiconductor device, illustrating a process sequence for Embodiment 6.
Figure 12B:
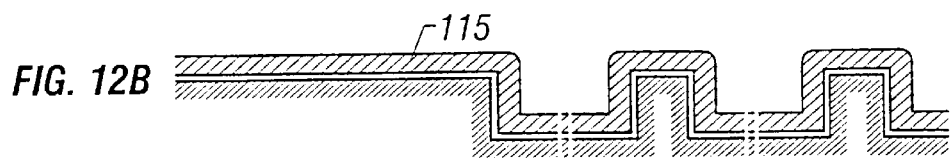
Figure 12C:
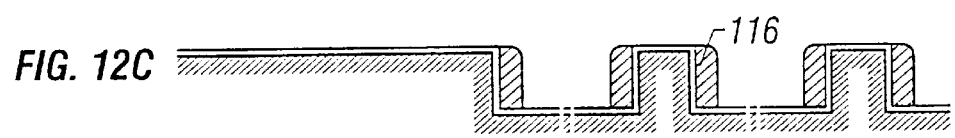

First, as shown in FIG. 12(A), a plurality of trenches or recesses 113 are formed in the surface of a semiconductor substrate 111, thus creating elevated portions 112. The height of the elevated portions 112 is the same as the height of the native surface of the semiconductor substrate. The depth of the trenches 113 is closely related to the channel length of the formed vertical channel device. To clearly show the interface with the semiconductor substrate, the interface and surface are indicated by hatching. This does not mean, however, that these portions differ from other portions in composition, conductivity, and other properties. The processing steps described thus far represent the step (11) above.

An oxide film 114 is formed on the semiconductor surface formed as described above by thermal oxidation or other well-known method (FIG. 12(A)). This represents the step (12) above.

Then, a first conductive film 115 is formed from a semiconductor material or the like by a well-known film formation technique. This represents the step (13) above. This technique must provide sufficient step coverage so that the film covers even the side surfaces of the elevated portions 112. Preferably, the thickness of this film is ⅕ to ½ of the depth of the trenches 113 (FIG. 12(B)).

Thereafter, the film 115 is etched by a well-known anisotropic etching. The represents the step (14) above. As a result, a film 116 becoming floating gates is left only on the sides surfaces of the elevated portions 112. The other portions are etched away. This film 116 extends continuously along the trenches (FIG. 12(C)).

Figure 12D:
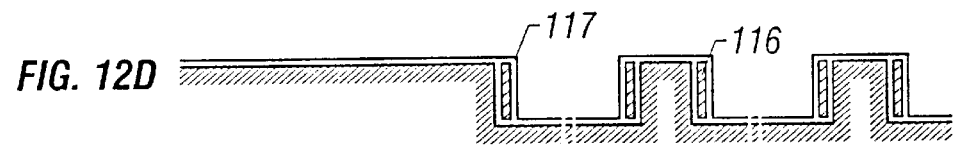
Figure 12E:
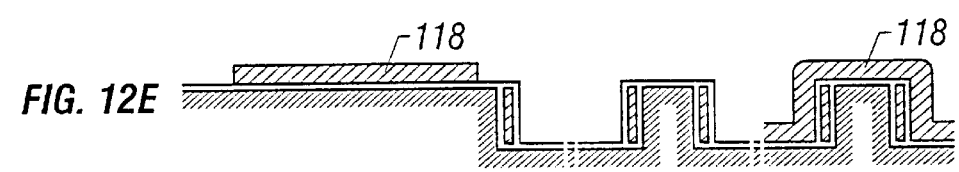
Figure 12F:
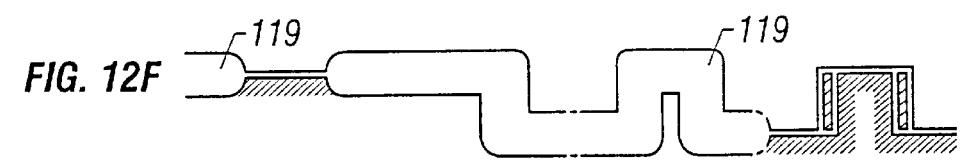
Figure 12G:
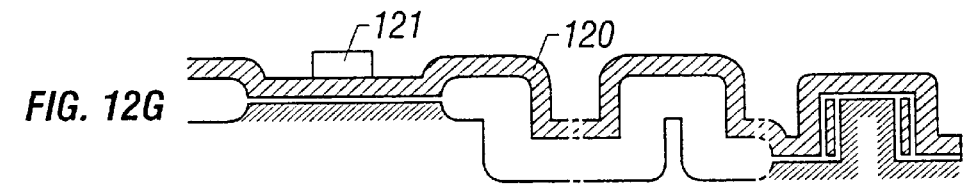
Figure 12H:
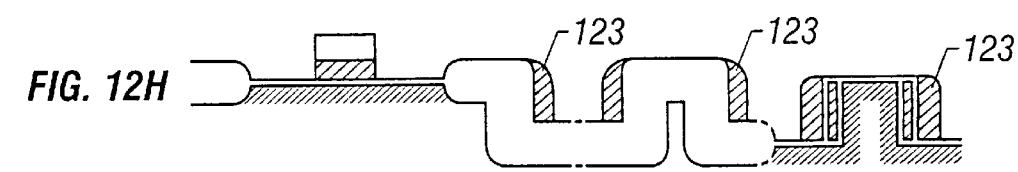
Figure 12I:
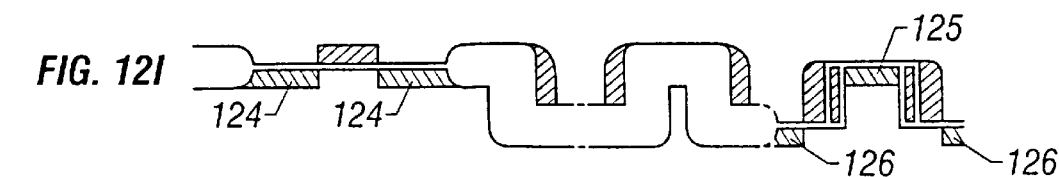

An insulating film 117 is formed on the film 116 by thermal oxidation or other well-known film formation technique (FIG. 12(D)). This represents the step (15) above.

Then, a selective oxidation step is carried out. This represents the step (16) above. For this purpose, a silicon nitride film is used as a mask for oxidation. That is, excluding the portion where an oxide is deposited (i.e., semiconductor portions on which device elements are formed), the mask for oxidation 118 is formed (FIG. 12(E)).

Subsequently, a thick oxide film 119 is formed on the unmasked portions by a thermal oxidation method, preferably steam thermal oxidation. Following this thermal oxidation, the mask for oxidation 118 is etched, thus completing the selective oxidation step (FIG. 12(F)).

Then, a second conductive film 120 is formed, using a semiconductor or metallic material by a well-known film formation technique. This represents the step (17). Also in this case, it is necessary that the adopted technique have excellent step coverage. Preferably, the thickness of the film is ⅕ to ½ of the depth of the trenches 113. A selective mask 121 is formed on the second conductive film 120 by a well-known photolithography method. This represents the step (18) above. What are covered with the mask 121 are those portions which become the gates of the planar MOS transistors and the parts becoming conductive interconnects using the second conductive film 120 (FIG. 12(G)).

Etching of the second conductive film 120 by a well-known anisotropic etching method comes next. This represents the step (19) above. As a result, a control gate 123 is left on each side surface of the elevated portions 112. At the same time, gates 122 of planar MOS transistors are built. The other portions are etched away. As shown to the right of the figure, the control gates 123 are formed on the film 116 which should become floating gates. As shown in the center, the control gates 123 are formed on the side surfaces of the elevated portions 112 outside the portions of the film 116 where the film 116 should become floating gates. That is, the control gates 123 are formed along the trenches 113 (FIG. 12(H)).

Then, impurity regions are built up by ion implantation or other well-known dopant diffusion technique. As a result, an impurity region 125 is formed on the top of each elevated portion 112. Also, an impurity region 126 is formed at the bottom of each trench 113. Furthermore, impurity regions 124 of planar MOS transistors are formed (FIG. 12(I)). In this way, a semiconductor device having nonvolatile memory cells can be manufactured.

Embodiment 7

Figure 13A:
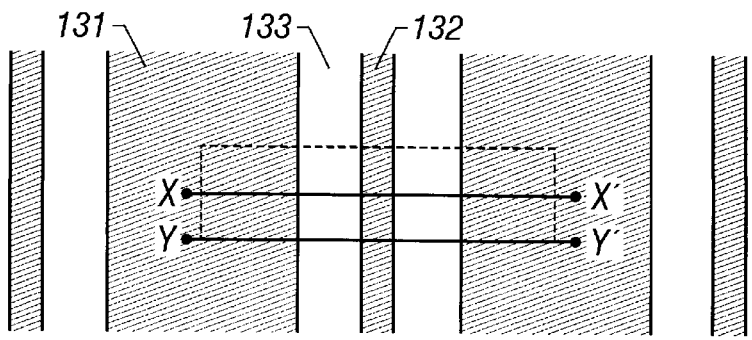
FIGS. 13(A)–13(D) are top views of a semiconductor device for Embodiment 7.
Figure 13B:
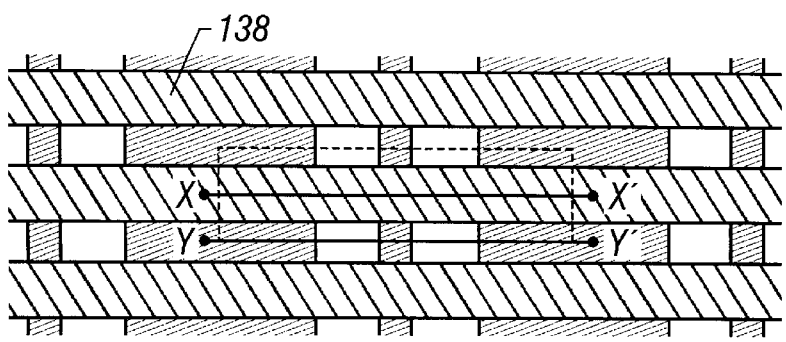
Figure 13C:
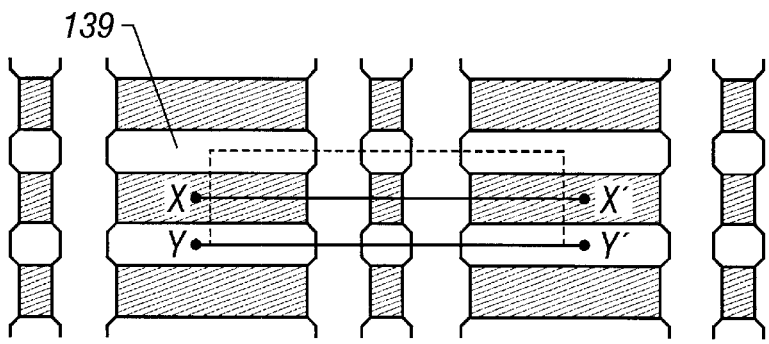
Figure 16A:
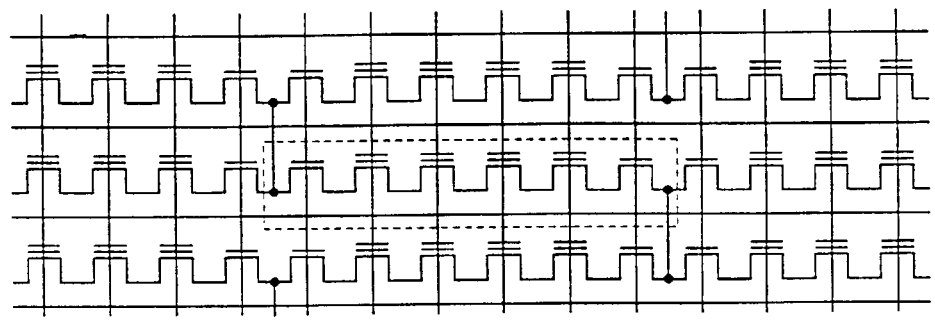
FIGS. 16(A) and 16(B) are circuit diagrams for Embodiment 7.
Figure 16B:
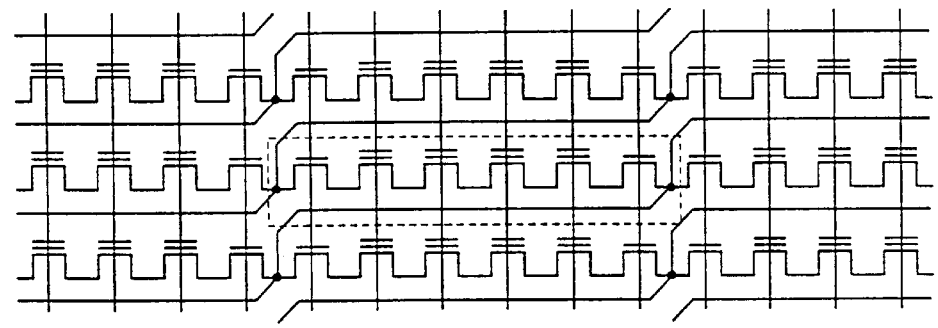
Figure 17A:
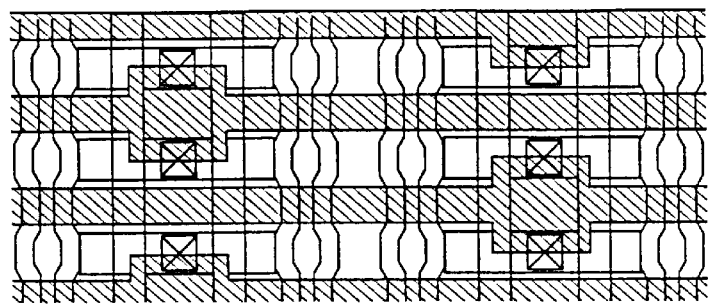
FIGS. 17(A) and 17(B) are diagrams illustrating the layout of the top layer of metallization of the semiconductor device for Embodiment 7.
Figure 17B:
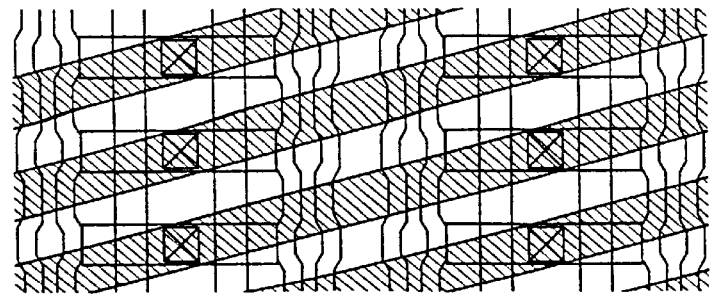

The present embodiment pertains to a process sequence and circuit configuration for a NAND nonvolatile memory device according to the present invention. The present embodiment is described by referring to FIGS. 13(A)–17(B). FIGS. 13(A)–13(D) are top views of main portions of a semiconductor device of the present embodiment, illustrating its process sequence. The rectangle surrounded by the dotted line shows a unit memory block. In the present embodiment, it is composed of 2 selecting transistors and 4 memory cells. FIGS. 14(A)–14(H) are cross-sectional views taken on the line X–X' of FIGS. 13(A)–13(C), illustrating the process sequence. FIGS. 15(A)–15(G) are cross-sectional views taken on the line Y–Y' of FIGS. 13(A)–13(C), illustrating the process sequence. FIGS. 17(A) and 17(B) show examples of layout of bits lines and ground lines, respectively, of the present embodiment. FIGS. 16(A) and 16(B) are circuit diagrams of these examples. The process sequences are next described.

First, in the same way as in Embodiment 6, trenches 133 are formed in a semiconductor substrate 131 to form elevated portions 132. An oxide film 134 is formed on the semiconductor surface by thermal oxidation or other well-known method. In FIGS. 13(A)–13(D), only those portions which have the same height as the native semiconductor substrate are indicated by the hatching. In FIGS. 14(A)–14(H) and 15(A)–15(G), the interface with the semiconductor substrate and the surface are indicated by the hatching for the same reason as in FIGS. 12(A)–12(I) (FIGS. 13(A), 14(A), and 15(A)).

Then, a first conductive film is formed, using a semiconductor material or the like, by a well-known film formation technique. The film is etched by a well-known anisotropic etching, in the same way as in Embodiment 6. As a result, a film 136 becoming floating gates is obtained only on the side surfaces of the elevated portions. This film 136 extends continuously along the trenches 133 (FIGS. 14(B) and 15(B)).

Thereafter, an insulating film is formed on the surface of the film 136 by thermal oxidation or other well-known film formation technique. In the same way as in Embodiment 6, selective oxidation is performed, using a silicon nitride film as an oxidation film. That is, as shown in FIG. 13(B), a mask for oxidation 138 is formed vertical to the trenches 133 (FIGS. 13(B), 14(C), and 15(C)).

Subsequently, a thick oxide film 139 is formed on the unmasked portions by a thermal oxidation method, preferably steam thermal oxidation. Since the cross section taken on the line X–X' (FIGS. 14(A)–14(H)) has been masked, the oxide film 139 is not present. In the cross section taken on line Y–Y' (FIGS. 15(A)–15(G)), the oxide film 139 is formed. Although not clearly shown in FIGS. 13(A)–13(D), this oxide 139 is also formed in the trenches 133, as can be seen from FIGS. 15(A)–15(G). That is, in FIGS. 13(A)–13(D), vertical device isolation is accomplished. During this oxidation step, the film 136 extending continuously along the trenches 133 is separated (FIGS. 13(C), 14(D), and 15(D)).

Then, a second conductive film 140 is formed, using a semiconductor or material, by a well-known film formation technique. Selective masks 141a and 141b are formed on the second conductive film 140 by a well-known photolithography method to obtain portions becoming the gates of selecting transistors consisting of planar MOS transistors (FIGS. 14(E) and 15(E)).

Thereafter, the second conductive film 140 is etched by a well-known anisotropic etching method. As a result, control gates 143a–143d are left on the side surfaces of the elevated portions. Also, gates 142a and 142b of the selecting transistors are formed. The other portions are etched away (FIGS. 14(F) and 15(F)).

Then, impurity regions are built up by ion implantation or other well-known dopant diffusion technique. The result is that impurity regions 145a–145d and 144a, 144b are formed on the top surfaces of the elevated portions. Impurity regions 146a and 146b are formed at the bottoms of the trenches (FIG. 14(G)).

Figure 13D:
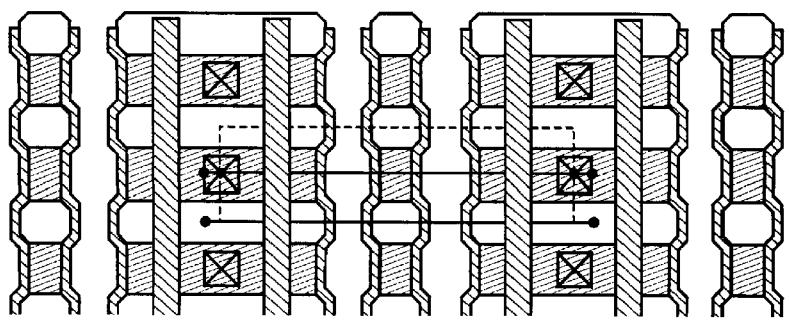
Figure 14A:
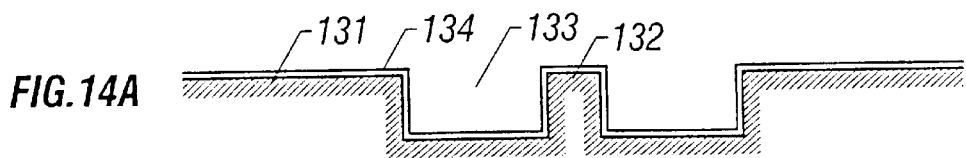
FIGS. 14(A)–14(H) are cross-sectional views of a semiconductor device for Embodiment 7.
Figure 14B:
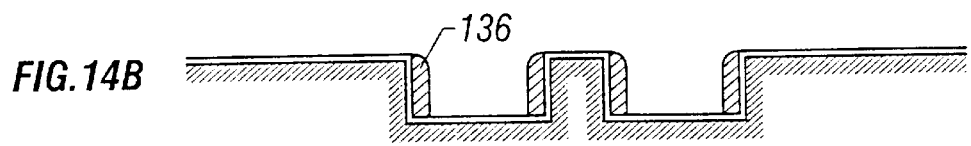
Figure 14C:
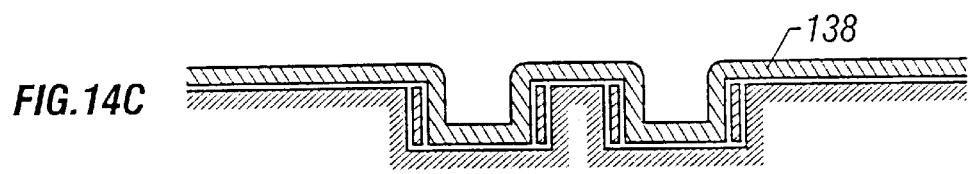
Figure 14D:
Figure 14E:
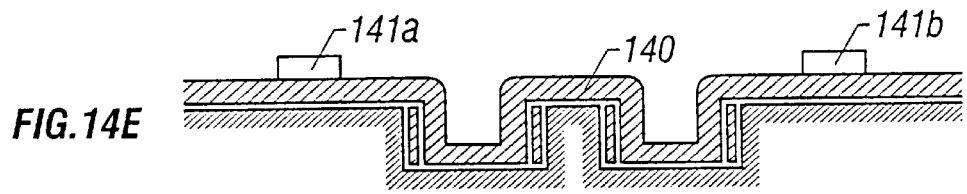
Figure 14F:
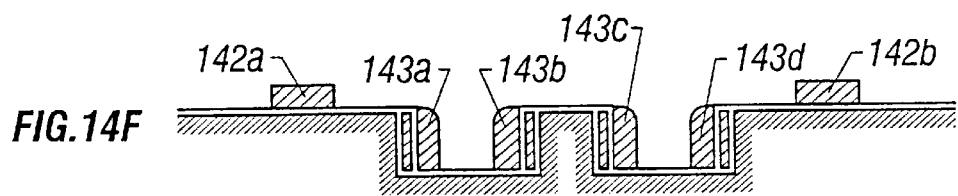
Figure 14G:
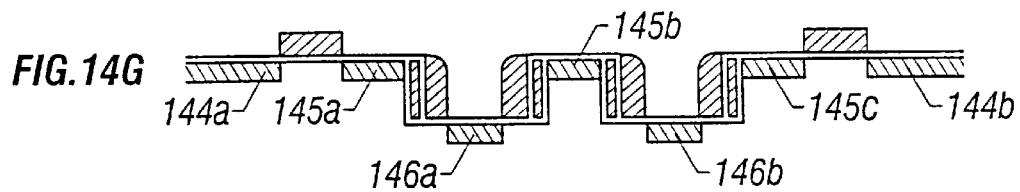
Figure 14H:
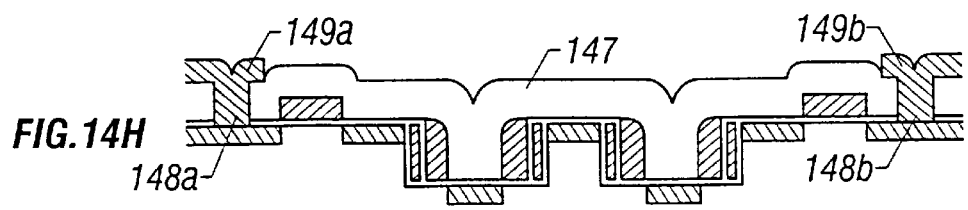
Figure 15A:
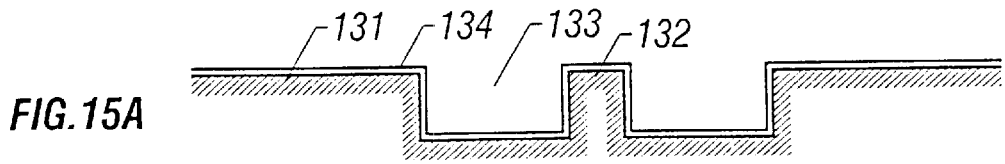
FIGS. 15(A)–15(G) are cross-sectional views of a semiconductor device for Embodiment 7.
Figure 15B:
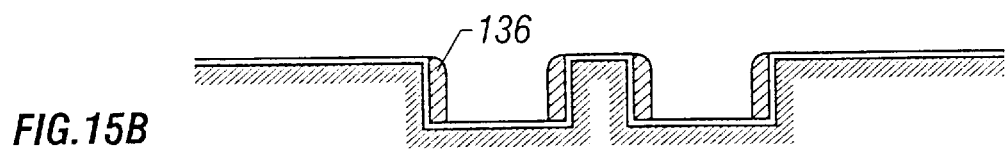
Figure 15C:
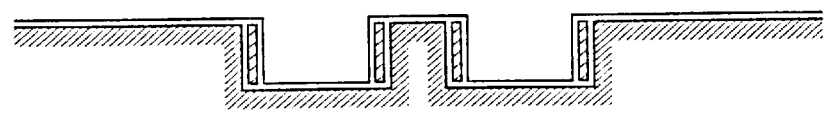
Figure 15D:
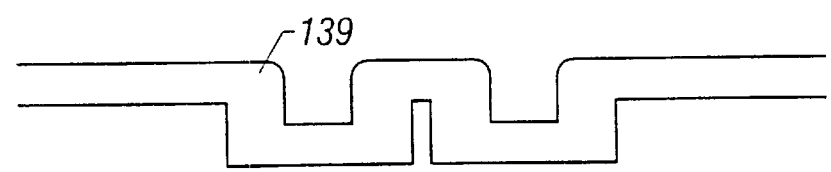
Figure 15E:
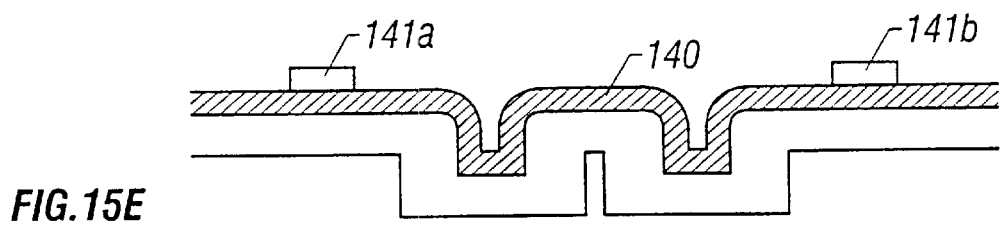
Figure 15F:
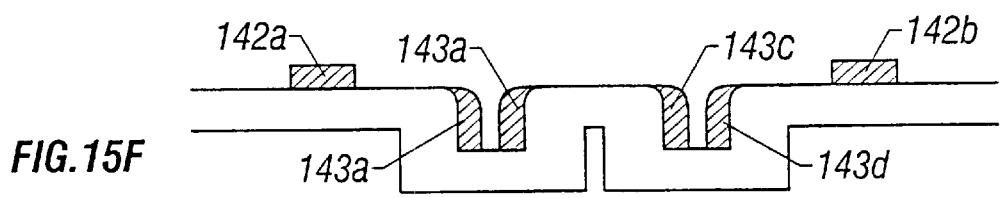
Figure 15G:
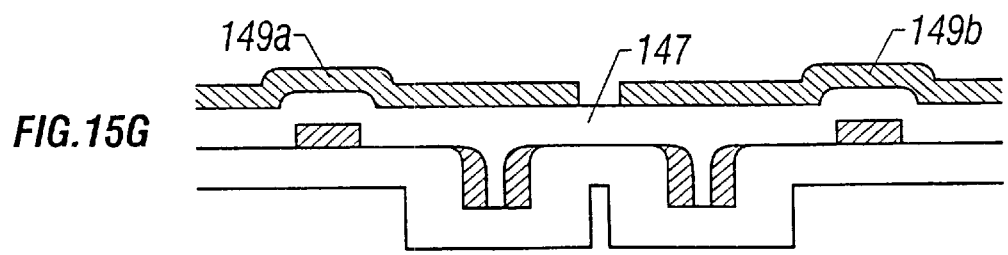

Subsequently, an interlayer insulator 147 is deposited by a well-known technique. Contact holes 148a and 148b extending to the impurity regions 144a and 144b, respectively, are opened. A top layer of metallization becoming bit lines or ground lines (in this embodiment, ground lines), 149a and 149b, is formed. The locations where the contact holes are created are shown in FIG. 13(D). In this way, the selecting transistors and memory cells can be fabricated (FIGS. 13(D), 14(H), and 15(G)).

There are two conceivable methods in laying out the bit lines or ground lines consisting of the top layer of metallization. The first method is illustrated in FIG. 17(A), where the top layer of metallization extends over the device isolating oxide 139 in a parallel relation to it. Its circuit diagram is shown in FIG. 16(A). With this method, however, the space between this top layer of metallization and the adjacent top layer of metallization cannot be reduced below the minimum design rule because there is a possibility that this top layer of metallization touches the adjacent top layer of metallization. Accordingly, it is difficult to form contacts while fully covering the contact holes (FIGS. 16(A) and 17(A)).

This problem can be solved by placing the top layers of metallization obliquely, as shown in FIG. 17(B). This circuit is shown in FIG. 16(B). Alternatively, the top layers of metallization may be placed in a zigzag fashion. In this scheme, conductive interconnects can be placed such that the contact holes are fully covered (FIGS. 16(B) and 17(B)). In this way, a nonvolatile memory device can be built.

In the above embodiment, the ground lines are formed parallel to the bit lines. It is also possible to fabricate the ground lines from impurity regions formed in a substrate. That is, when the device isolating oxide is deposited, an impurity region 144c extending from top to down as viewed in the figure is formed in one region where a planar MOS transistor should be formed, as shown in FIG. 18.

Figure 18:
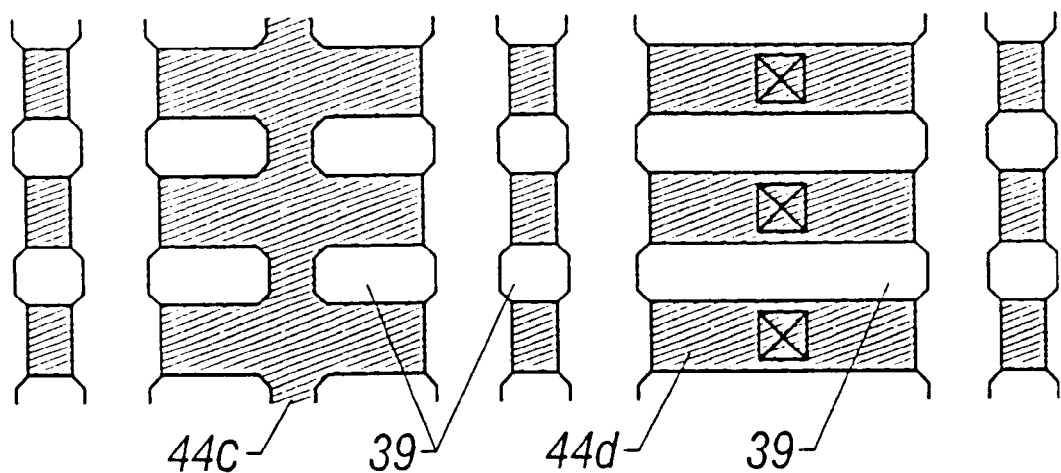
FIG. 18 is a diagram illustrating the arrangement of a device isolating insulator, impurity regions, and contacts in the semiconductor device for Embodiment 7.

FIG. 18 shows the state in which control gates and other gates have been removed after completing a doping process. An impurity region 144d corresponds to the impurity region 144b shown in FIG. 14(G). In this configuration, there are contacts to the bit lines. On the other hand, the impurity region 144c has no contact to each memory block. The impurity region extending from top to bottom acts as ground lines. This increases the resistance of the ground lines but the number of contacts can be halved (FIG. 18).

According to the present invention, a semiconductor device with high device density can be fabricated. The present invention has made great strides toward increasing the scale of integration of NAND-type nonvolatile memory device. In this way, the invention yields industrially useful advantages.

What is claimed:

1. A semiconductor device comprising:
   first, second and third elevated portions formed on a semiconductor substrate adjacently to each other;
   at least two floating gates formed by anisotropic etching, said floating gates being formed on both side surfaces of said first and third elevated portions, respectively, said floating gates being electrically isolated from each other;
   control gates formed by anisotropic etching so as to cover said floating gates, respectively;
   second gates formed by anisotropic etching on both side surfaces of said second elevated portion interposed between said first and third elevated portions;
   an interlayer insulator covering all of said first through third elevated portions, said control gates, and said second gates; and
   a top layer of metallization formed over said interlayer insulator and intersecting said control gates and said second gates, said top layer of metallization being not in contact with said first and third elevated portions but with said second elevated portion.

2. A semiconductor device comprising:

first elevated portions formed on a semiconductor substrate;

floating gates formed by anisotropic etching and electrically isolated from each other, said floating gates being located on both side surfaces of said first elevated portions;

second elevated portions formed on said semiconductor substrate and having no floating gates on both side surfaces of each of said second elevated portions:

control gates or second gates formed by anisotropic etching on the side surfaces of said first and second elevated portions;

an interlayer insulator formed over said first and second elevated portions and over said control gates or second gates; and a top layer of metallization formed over said interlayer insulator and intersecting said control gates and second gates, said top layer of metallization being in contact with none of said first elevated portions but will all of said second elevated portions.

3. A semiconductor device comprising a NAND-type nonvolatile memory device consisting of a plurality of blocks, each block having a plurality of memory cells having floating gates and connected in series, and at least two selecting transistors connected and interposed said memory cells connected in series, each of said memory cells comprising impurity regions on a top of elevated portions and in trenches located between the elevated portions, and floating gates and control gates formed on side surfaces of said elevated portions by anisotropic etching, said elevated portions being formed by forming the trenches in a semiconductor substrate, said floating gates being isolated by an oxide formed for device isolation, said selecting transistors being formed on said elevated portions on said semiconductor substrate, said selecting transistors having gates formed simultaneously with said control gates of said memory cells, said gates of said selecting transistors being arranged in parallel with said control gates, said impurity regions of said selecting transistors being formed simultaneously with said impurity regions of said memory cells, and bit lines or ground lines formed on an interlayer insulator and having contacts to one of said impurity regions of said selecting transistors.

4. The semiconductor device of claim 3 wherein said oxide for device isolating is substantially perpendicular to said elevated portions.

5. The semiconductor device of claim 3 wherein said oxide for device isolating is substantially perpendicular to said control gates.

* * * * *